United States Patent
Gillin et al.

(10) Patent No.: US 10,382,050 B1
(45) Date of Patent: Aug. 13, 2019

(54) INTEGRATED MULTIPLYING SUCCESSIVE APPROXIMATION ANALOG TO DIGITAL CONVERTER

(71) Applicant: Dialog Semiconductor (UK) Limited, London (GB)

(72) Inventors: Donesh Gillin, Santa Clara, CA (US); Arun Sundar, Santa Clara, CA (US); Bindhu Vasu, Santa Clara, CA (US)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/989,362

(22) Filed: May 25, 2018

(51) Int. Cl.
*H03M 1/10* (2006.01)
(52) U.S. Cl.
CPC .................. *H03M 1/1019* (2013.01)
(58) Field of Classification Search
CPC . H03M 1/1019; H03M 1/1023; H03M 1/1038
USPC ................. 341/144, 155, 163, 120, 118, 139
See application file for complete search history.

(56) References Cited

U.S. PATENT DOCUMENTS

| | | | | |
|---|---|---|---|---|
| 7,038,609 B1* | 5/2006 | Hurrell | ................. | H03M 1/145 341/156 |
| 7,095,346 B2* | 8/2006 | Bogner | ................. | H03M 1/109 341/120 |
| 7,391,452 B2* | 6/2008 | Itani | ...................... | H03M 1/187 341/139 |
| 9,160,360 B1* | 10/2015 | Lien | .................... | H03M 1/1215 |

* cited by examiner

*Primary Examiner* — Peguy Jean Pierre
(74) *Attorney, Agent, or Firm* — Saile Ackerman LLC; Stephen B. Ackerman

(57) ABSTRACT

An analog-to-digital converter ADC and a method to convert an analog input signal into a digital output signal comprising N bits $o_n$, $n \in \{0, \ldots, N-1\}$ is presented. The ADC contains a controller, a digital-to-analog converter DAC, and a comparator. The comparator generates a binary signal by comparing the analog input signal with an analog output signal of the DAC. The controller receives the binary signal generated by the comparator and generates, based on the binary signal, a digital control signal comprising N bits $c_n$, $n \in \{0, \ldots, N-1\}$. The DAC generates the analog output signal based on the digital control signal generated by the controller. The controller has a register which stores a previous sum value and an adder to determine a test sum value by adding.

22 Claims, 4 Drawing Sheets

INTEGRATED MULTIPLYING SUCCESSIVE APPROXIMATION ANALOG TO DIGITAL CONVERTER

TECHNICAL FIELD

The present document relates to analog-to-digital converters (ADC). In particular, the present document relates to successive approximation (SAR) ADCs that convert a continuous analog waveform into a discrete digital representation via a binary search.

BACKGROUND

FIG. 1 illustrates an exemplary analog-to-digital converter ADC which is based on the successive approximation SAR principle. Typically, such an ADC comprises an analog voltage comparator 12 for comparing an analog input voltage to the output of an internal digital-to-analog converter DAC 11 and for outputting the result of the comparison to a SAR logic unit 10. Although FIG. 1 shows a circuit alternative in which the analog input voltage is applied via a multiplexer 13, switching elements 14 and capacitor 16 to the same input terminal of comparator 12 to which also the output of the DAC 11 is connected (also via switching elements 14 and capacitor 16), it may be assumed that—in a simplified design of the ADC—the analog input voltage and the output signal of the DAC 11 are applied to two different terminals of the comparator 12. For example, the analog input voltage may be applied to the inverting input of the comparator 12 and the output voltage of the DAC 11 may be applied to the non-inverting input of the comparator 12, or vice versa.

In the following, an overview of the SAR algorithm is given with reference to the example circuit depicted in FIG. 1. The SAR logic unit 10 is initialized so that the most significant bit (MSB) is equal to a digital 1. In FIG. 1 for example, bit D7 may be set to 1, while the remaining bits D6 to D0 are set to 0. This digital code D7-D0 is fed to the DAC 11, which then supplies the analog equivalent of this digital code to the comparator 12 for comparison with the analog input voltage. If the output voltage of the DAC 11 exceeds the analog input voltage, the comparator 12 causes the SAR logic unit 10 to reset this bit; otherwise, the bit is left a 1. Then the next bit is set to 1 and the same test is done, continuing this binary search until every bit D7-D0 has been tested. The resulting code D7-D0 is the digital approximation of the analog input voltage and is finally output by the ADC as an 8-bit result at the end of the conversion.

Typically, the digital output signal provided by the ADC converter needs to be calibrated to compensate for variations in the design and/or to map the digital output signal to a desired range. For instance, the analog input signal may represent a temperature measurement and the raw data of the digital output signal needs to be mapped to degree centigrade. For this purpose, a slope correction factor as well as an offset may be determined for calibrating the digital output signal accordingly. In general, both slope correction factor and offset may be determined in a pre-operational phase of the ADC by analyzing at least two non-calibrated conversion results of the ADC. During operation of the ADC, the digital output signal of the DAC 11 is multiplied with the determined slope correction factor in multiplier 18 and the determined offset is added to this signal in adder 19.

However, current ADC calibration and mapping techniques require a separate block to perform the desired operations, i.e. the multiplication in multiplier 18 and the addition in adder 19. Moreover, these operations are performed after the result is provided by the actual ADC converter, i.e. after the result is provided by the DAC 11 in FIG. 1. These additional operations, in particular the multiplication, are costly due to the required space of multiplier 18 and involve an additional time delay. Moreover, the space required for the additional multiplier 18 substantially increases as the number of bits of the digital output signal increases.

SUMMARY

The present document addresses the above mentioned technical problems. In particular, the present document addresses the technical problem of providing an analog-to-digital converter ADC based on the successive approximation principle with improved calibration of the digital output signal in terms of processing time and die area. According to an aspect, an analog-to-digital converter ADC is presented which is configured to convert an analog input signal into a digital output signal comprising N bits $o_n$, $n \in \{0, \ldots, N-1\}$. The analog input signal may be e.g. an input voltage or an input current which is measured over a shunt resistance. The ADC may comprise a controller, a digital-to-analog converter DAC, and a comparator. The comparator may be configured to generate a binary signal by comparing the analog input signal with an analog output signal of the DAC. The controller may be configured to receive the binary signal generated by the comparator and to generate, based on the binary signal, a digital control signal comprising N bits $c_n$, $n \in \{0, \ldots, N-1\}$. The DAC may be configured to generate the analog output signal based on the digital control signal generated by the controller. The controller may comprise a register configured to store a previous sum value and an adder configured to determine a test sum value by adding, when the ADC determines the bit $o_n$ of the digital output signal, the previous sum value and a test value corresponding to $2^n$ times a gain factor. The bits $o_n$ of the digital output signal are returned by the ADC after the conversion has finished.

The presented ADC relies on an implicit shift adder in the conventional SAR algorithm and adds an additional adder (which may be e.g. part of an arithmetic logic unit AU or of a floating-point unit FPU) for determining a test sum value for the nth bit instead of simply setting the nth bit to 1 in the conventional SAR algorithm. In general, the test value may be represented by a binary representation of the gain factor which is shifted by n bits, i.e. shifted to the position of the bit $o_n$ of the digital output signal which is currently tested. For the special case of a gain factor equal to 1, the claimed ADC behaves similar to a conventional SAR ADC i.e. the nth bit is set to 1 and a test value is added in which the nth bit is 1 and all other bits are 0. In other words, if the gain factor is chosen to be 1, the additional adder is actually not required. Thus, in order to practice the present invention, the gain factor is preferably chosen different from unity, i.e. different from 1.

If the gain factor is chosen different from 1, an additional multiplication operation is folded into the control of the DAC. This expansion of the shift operation in a SAR DAC acts as a multiplier which is not included in the conventional design. Therefore, the need for an additional costly digital multiplication block for multiplying the result of an conventional SAR ADC is removed at the cost of slightly increasing the control overhead of the claimed ADC, e.g. by an additional adder and by additional registers. This can result in both space and time savings.

In order to achieve a desired slope correction factor, the gain factor needs to be set to the multiplicative inverse of said slope correction factor, i.e. the gain factor needs to be set to 1 divided by the slope correction factor. As a result, the values of the digital output signal of the claimed ADC are an approximation of the digital output signal of a conventional SAR ADC multiplied by the slope correction factor.

On the one hand, the proposed controller may be configured to generate the digital control signal based on the test sum value, and, if the binary signal indicates that the analog input signal is greater than the analog output signal corresponding to the test sum value, to store the test sum value in the register as a new sum value. In other words, the register may be updated with the test sum value such that the previous sum value previously stored at the register is no longer valid. For example, the previous sum value may be overwritten by the test sum value. On the other hand, the controller may be configured to leave the previous sum value unchanged and not increment the previous sum value with the test value if the binary signal indicates that the analog input signal is smaller than or equal to the analog output signal corresponding to the test sum value.

Further, the ADC may be configured to set the bit $o_n$ of the digital output signal to 1 if the binary signal indicates that the analog input signal is greater than the analog output signal corresponding to the test sum value. The ADC may be configured to set the bit $o_n$ of the digital output signal to 0 if the binary signal indicates that the analog input signal is smaller than or equal to the analog output signal corresponding to the test sum value.

The proposed controller may be configured to start the analog-to-digital conversion with the most significant bit MSB $o_{N-1}$ of the digital output signal by initializing the previous sum value to 0 or to a predetermined offset value. If the MSB is set to a predetermined offset value, the values of the digital output signal of the claimed ADC are an approximation of the digital output signal of a conventional SAR ADC plus an additional offset corresponding to said predetermined offset value. In other words, any post-processing adder which may be required to calibrate the output of a conventional SAR ADC is replaced by pre-seeding the register of the controller with said predetermined offset value. If the addition of a negative number is desired, the binary compliment of the corresponding binary number may be used.

The ADC may be configured to start the analog-to-digital conversion by determining the most significant bit MSB $o_{N-1}$ of the digital output signal first, and continuing, bit by bit, until the least significant bit (LSB) $o_0$ of the digital output signal is determined. At the end of the conversion process, the digital control signal may be equal to the digital output signal.

According to another aspect, a controller for controlling operation of an analog-to-digital converter ADC is presented. The ADC may be configured to convert an analog input signal into a digital output signal comprising N bits $o_n$, $n \in \{0, \ldots, N-1\}$, wherein the ADC may comprise a digital-to-analog converter DAC and a comparator. The comparator may be configured to generate a binary signal by comparing the analog input signal with an analog output signal of the DAC, and the DAC may be configured to generate the analog output signal based on a digital control signal. The controller may be configured to receive the binary signal generated by the comparator and to generate, based on the binary signal, the digital control signal comprising N bits $c_n$, $n \in \{0, \ldots, N-1\}$ for controlling the DAC. Moreover, the controller may comprise a register configured to store a previous sum value and an adder configured to determine a test sum value by adding, when determining the bit $o_n$ of the digital output signal, the previous sum value and a test value corresponding to $2^n$ times a gain factor. The test value may be represented by a binary representation of the gain factor which is shifted by n bits. The controller may be configured to generate the digital control signal based on the test sum value, and, if the binary signal indicates that the analog input signal is greater than the analog output signal corresponding to the test sum value, to store the test sum value in the register as a new sum value.

On the one hand, the controller may be configured to set the bit $o_n$ of the digital output signal to 1 if the binary signal indicates that the analog input signal is greater than the analog output signal corresponding to the test sum value. On the other hand, the controller may be configured to set the bit $o_n$ of the digital output signal to 0 if the binary signal indicates that the analog input signal is smaller than or equal to the analog output signal corresponding to the test sum value.

The controller may be configured to start the analog-to-digital conversion with the most significant bit MSB $o_{N-1}$ of the digital output signal by initializing the previous sum value to 0 or to a predetermined offset value. To be more specific, the controller may be configured to start the analog-to-digital conversion by determining the most significant bit MSB $o_{N-1}$ of the digital output signal first, and continuing, bit by bit, until the least significant bit LSB $o_0$ of the digital output signal is determined.

According to yet another aspect, a method of converting an analog input signal into a digital output signal is presented, wherein the digital output signal comprises N bits $o_n$, $n \in \{0, \ldots, N-1\}$. The method uses or provides a digital-to-analog converter DAC and a comparator. One step of the method may comprise generating, by the comparator, a binary signal by comparing the analog input signal with an analog output signal of the DAC. Another step of the method may comprise generating, by the DAC, the analog output signal based on a digital control signal comprising N bits $c_n$, $n \in \{0, \ldots, N-1\}$. The digital control signal for controlling the DAC may be generated based on the binary signal. A previous sum value may be stored in a register and a test sum value may be determined by adding, when the ADC determines the bit $o_n$ of the digital output signal, the previous sum value and a test value corresponding to $2^n$ times a gain factor. The test value may be obtained by shifting a binary representation of the gain factor by n bits.

The method may further comprise generating the digital control signal based on the test sum value, and, if the binary signal indicates that the analog input signal is greater than the analog output signal corresponding to the test sum value, storing the test sum value as a new sum value.

On the one hand, the method may further comprise setting the bit $o_n$ of the digital output signal to 1 if the binary signal indicates that the analog input signal is greater than the analog output signal corresponding to the test sum value. On the other hand, the method may further comprise setting the bit $o_n$ of the digital output signal to 0 if the binary signal indicates that the analog input signal is smaller than the analog output signal corresponding to the test sum value.

The method may start the analog-to-digital conversion with the most significant bit MSB $o_{N-1}$ of the digital output signal by initializing the previous sum value to 0 or to a predetermined offset value. Specifically, the method may start the analog-to-digital conversion by determining the most significant bit MSB $o_{N-1}$ of the digital output signal first, and continuing, bit by bit, until the least significant bit LSB $o_0$ of the digital output signal is determined.

The method may further include determining a further test sum value by adding the previous sum value and a further test value corresponding to $2^n$ times the gain factor, wherein n is an integer which is either smaller than 0 or greater then N−1; and amending the digital output signal comprising bits $o_n$, $n \in \{0, \ldots, N-1\}$ based on said determined further test sum value.

For example, the method may further comprise determining further $o_n$-values by adding the previous sum value and a further test value corresponding to $2^n$ times the gain factor, wherein n is an integer which is either smaller than 0 or greater then N−1. The method may further comprise amending the digital control signal, $c_m$, wherein the new corresponding test sum maps to the $\{0, \ldots, M-1\}$-range of said digital control signal or setting to maximum that range if exceeded upon finally returning an expanded output signal comprising bits $o_n$, $n \in \{0, \ldots, N-1\}$ based on said determined further test sum value. In other words, the number of digital control bits may be different from the number of digital output bits. In particular, the number of digital control bits may be larger than the number of digital output bits.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple", "connect", "coupled" or "connected" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1:
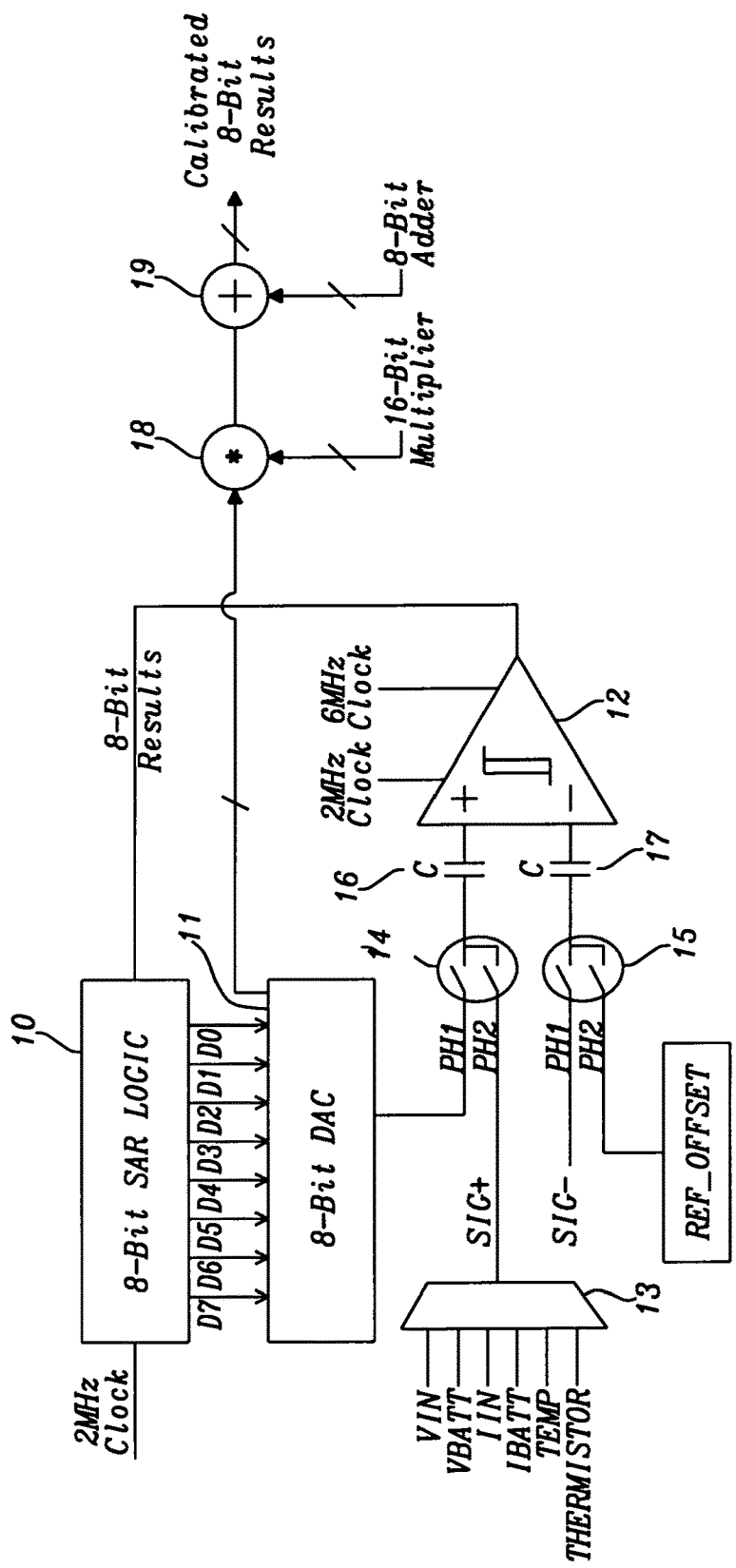
FIG. 1 shows a circuit diagram of an exemplary SAR ADC.

FIG. 1 shows a circuit diagram of an exemplary SAR ADC which is known from the prior art. The ADC comprises an analog voltage comparator 12 that compares an analog input voltage to the output of an internal digital-to-analog converter DAC 11 and outputs the result of the comparison to a SAR logic unit 10 (also denoted as controller in the following description). FIG. 1 shows a circuit in which the analog input voltage is applied via a multiplexer 13, switching elements 14 and capacitor 16 to the same input terminal of comparator 12 to which also the output of DAC 11 is connected. In fact, the output of DAC 11 is connected to the same input terminal via switching elements 14 and capacitor 16, too. Further, a reference offset voltage is applied to the second input terminal of the comparator 12 via switching elements 15 and capacitor 17. However, it should be noted that—in an alternative design of the ADC in FIG. 1—multiplexer 13, switching elements 14, 15, and capacitors 16, 17 may be omitted, and the analog input voltage and the output signal of the DAC 11 may be directly applied to two different terminals of the comparator 12. For example, the analog input voltage may be applied to the inverting input of the comparator 12 and the output voltage of the DAC 11 may be applied to the non-inverting input of the comparator 12, or vice versa.

The output of the DAC 11 is connected to a 16-bit multiplier 18, whose output is in turn connected to the input of an 8-bit adder 19. In general, the system may comprise an n-bit multiplier and an m-bit adder. As described in the background section, the multiplier 18 and the adder 19 are required to map the output signal of the conventional SAR DAC to a desired range.

The overall system depicted in FIG. 1 comprises a first, explicit serial multiplier 18 which is employed during calibration of the results provided by the DAC 11. Moreover, the system described in FIG. 1 comprises a second, implicit multiplier which is hidden in the mathematics of the SAR algorithm. The present invention attempts to exploit and modify this second, implicit multiplier in order to integrate the first, explicit multiplier into the SAR algorithm and, hence, make the first, explicit serial multiplier 18 dispensable.

As a matter of fact, the steps carried out by the SAR algorithm are comparable to a serial shift and add multiplier with an added decision step. The SAR logic is however implemented differently as this implicit multiplier is a special case without ripple carries. Instead, the SAR algorithm performs this implicit multiplication by setting the bit under test (BUT) to binary 1, i.e. to b'1 and then by making a decision on the modified DAC output signal versus the analog input voltage. This decision is then carried forward to the next step of the algorithm. This starts at the MSB and is right shifted towards the LSB for each iteration of the SAR algorithm.

Figure 2:
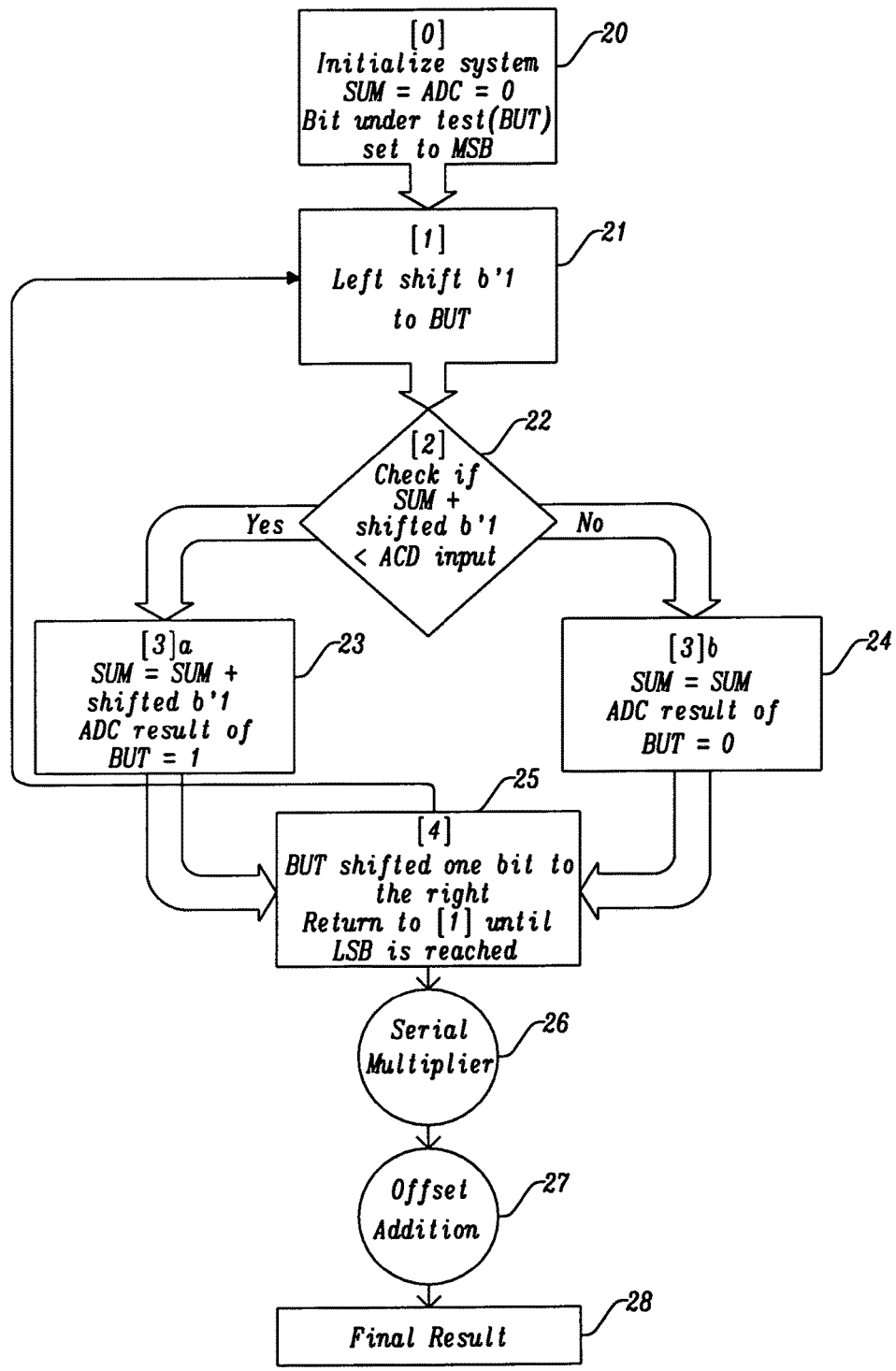
FIG. 2 shows a flow diagram of an exemplary successive approximation algorithm.

The inventors of the present invention have recognized that the conventional SAR algorithm illustrated in FIG. 2 essentially carries out similar steps as performed in a serial multiplication. It is equivalent to left shifting b'1 to the bit under test and then adding that value to a current sum value. If this result is less than the analog input voltage, the sum value is updated to be the previous sum value plus this shifted b'1 value.

In order to show the similarity between the conventional SAR algorithm and a shift-and-add multiplication, a special notation of the conventional SAR algorithm is used in FIG. 2 which includes not only an ADC variable representing the digital control signal provided by the controller 10 to the DAC 11, but also a sum value SUM. However, it is important to note that the flow diagram in FIG. 2 explicitly separates out the ADC variable and the sum value SUM used in the SAR algorithm for clarity purposes only. For a typical SAR algorithm, these two values are equal to each other and implicit.

At step 20 of the SAR algorithm in FIG. 2, the system is initialized by setting both a SUM variable and an ADC variable to 0. At step 21, a binary 1 (b'1) is shifted to the bit under test BUT, i.e. in the first step of the algorithm the position of the MSB. At step 22, a check is performed whether the sum of the SUM variable and the shifted binary 1 is smaller than the analog input signal. If yes, the algorithm branches to step 23 in which the SUM variable is incremented by the value of the binary 1 shifted to the BUT, and the bit in the ADC variable at the position of the BUT is set to 1. If now, the algorithm branches to step 24, in which the SUM variable remains unchanged and the bit in the ADC variable at the position of the BUT is set to 0. At step 25, the BUT is shifted one bit to the right, and the algorithm jumps back to step 21 until the LSB is reached. As already mentioned above, a multiplication and an addition are carried for calibration purposes in subsequent steps 26 and 27, respectively. The algorithm terminates in step 28.

A step by step operation of the typical SAR algorithm is displayed in Table 1 below. For this system the LSB of the DAC is 1.0V with an analog input signal (ADC input) of 5.0V. For post calibration, the multiplier has a gain (slope correction factor) of 2 and an offset of 1. The multiplier doesn't have to be an explicit power of 2, but is set so for ease of example. The table walks through each step of the SAR algorithm with updated values for that step in bold. The system result has a final 1 bit LSB error further multiplied by the serial multiplier.

TABLE 1

Typical SAR Operation

| LSB<br>Gain<br>Cycle:Step | 1 V<br>2<br>SUM | ADC Input<br>Offset<br>ADC | 5 V<br>1<br>BUT | Shifted<br>'b1 | SUM +<br>Shift | ADC<br>Decision |
|---|---|---|---|---|---|---|
| 1:0 | 0000 | 0000 | 1000 | | | |
| 1:1 | 0000 | 0000 | 1000 | 1000 | | |
| 1:2 | 0000 | 0000 | 1000 | 1000 | 1000 | N |
| 1:3b | 0000 | 0000 | 1000 | | | |
| 1:4 | 0000 | 0000 | 0100 | | | |
| 2:1 | 0000 | 0000 | 0100 | 0100 | | |
| 2:2 | 0000 | 0000 | 0100 | 0100 | 0100 | Y |
| 2:3a | 0100 | 0100 | 0100 | | | |
| 2:4 | 0100 | 0100 | 0010 | | | |
| 3:1 | 0100 | 0100 | 0010 | 0010 | | |
| 3:2 | 0100 | 0100 | 0010 | 0010 | 0110 | N |
| 3:3b | 0100 | 0100 | 0010 | | | |
| 3:4 | 0100 | 0100 | 0001 | | | |
| 4:1 | 0100 | 0100 | 0001 | 0001 | | |
| 4:2 | 0100 | 0100 | 0001 | 0001 | 0101 | N |
| 4:3b | 0100 | 0100 | 0001 | | | |
| 4:4 | 0100 | 0100 | 0000.1 | | | |
| SAR Output | 0100 | | 4 | | | |
| Serial Multiplier | 1000 | | 8 | | | |
| Offset Addition | 1001 | | 9 | | | |
| Final Result | 1001 | | 9 | | | |

Figure 3:
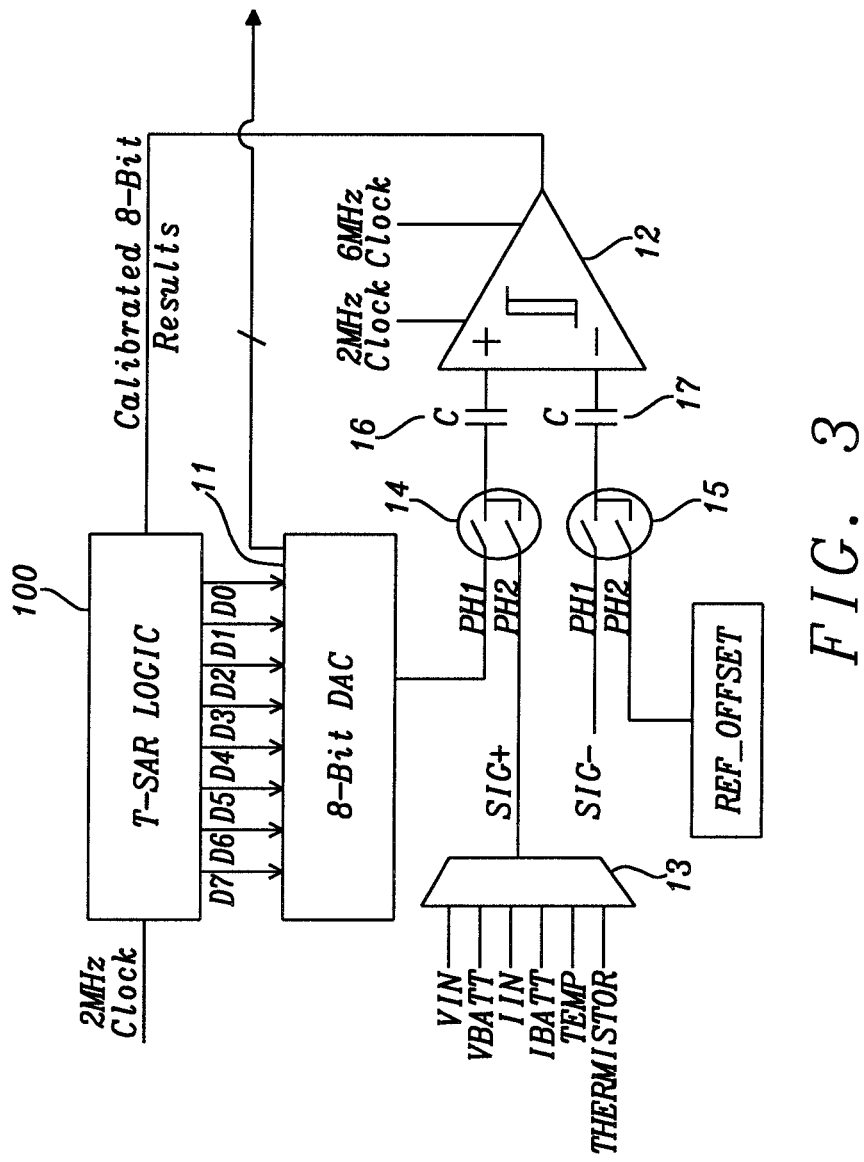
FIG. 3 shows a circuit diagram of another exemplary SAR ADC.

FIG. 3 shows a circuit diagram of an exemplary SAR ADC which is based on the ideas of the present invention. In the SAR ADC of FIG. 3, the post processing multiplication and addition are folded into the control of the DAC 11. For this purpose, a transpose SAR (T-SAR) logic unit 100 is used. The remaining circuit components are identical to those in FIG. 1.

Figure 4:
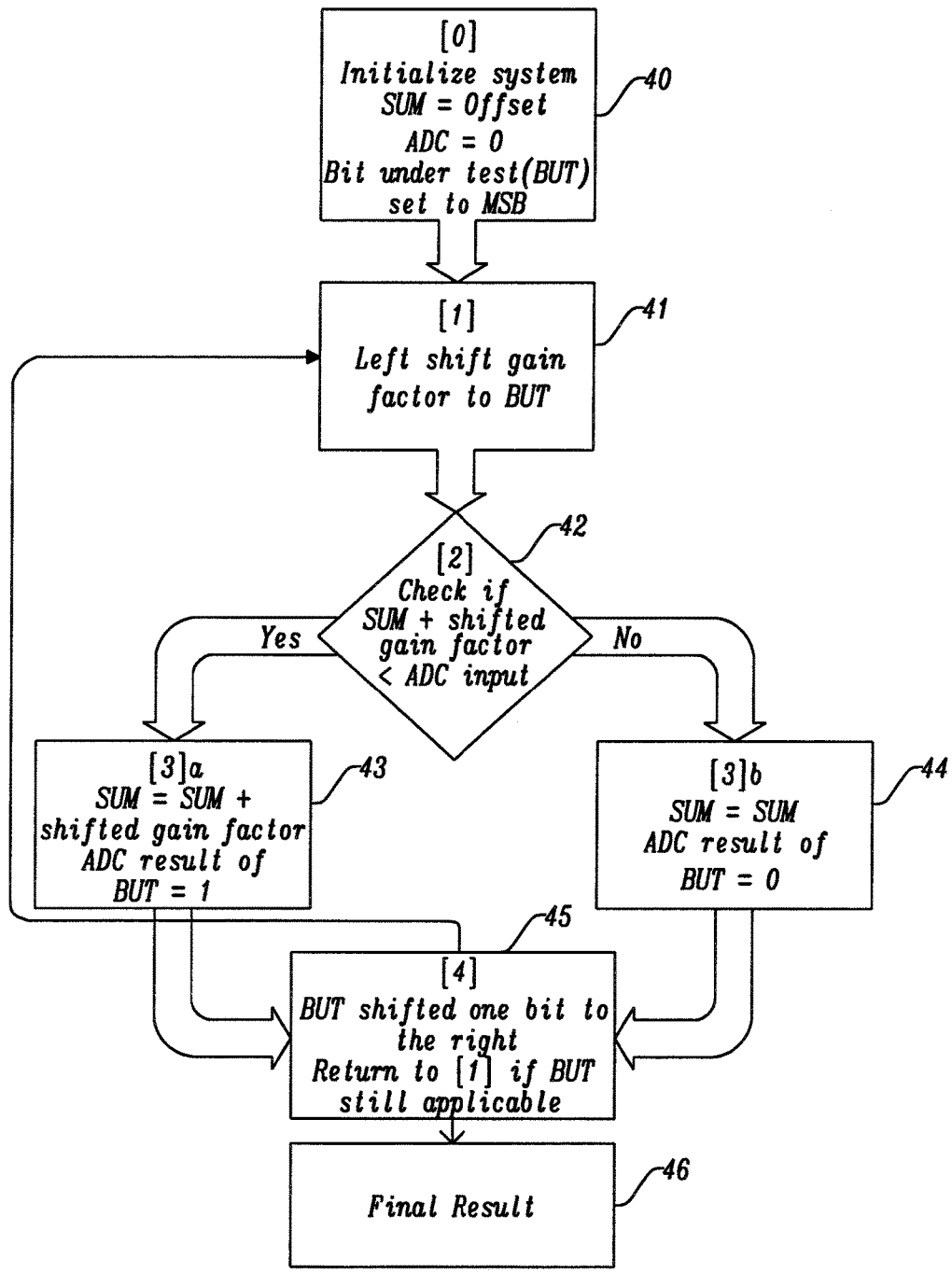
FIG. 4 shows a flow diagram of another exemplary successive approximation algorithm.

FIG. 4 shows a flow diagram of an exemplary successive approximation algorithm based on the principles of the present invention. The transpose SAR folds the post processing multiplier and adder into the implicit SAR serial multiplier discussed above. To do this, the system no longer shifts a binary 1 b'1 into the bit under test BUT. Instead, the system shifts an N-bit gain factor into the BUT (step 41). The resulting test value is then added to the SUM variable and compared to the analog input voltage, i.e. the ADC input (step 42). If it is less than the ADC input, the SUM has the shifted gain factor added to it (step 43). If not, the current value of the SUM is retained (step 44). The BUT is now right shifted once (step 45) and the algorithm repeats itself.

It is important to note that, in FIG. 4, the post processing adder 19 is replaced by pre-seeding the SUM register with the desired offset. If the desired offset is negative, the 2's compliment is used. Together these two changes completely remove the post processing required.

The transpose SAR breaks the equality between the SUM and ADC result. For each BUT, the ADC result of that bit is set to 1 if the SUM plus the shifted gain factor is less than the ADC input. This creates a difference in the SUM, as the ADC result is only shifted a single bit, whereas the SUM has the shifted gain factor added to it.

The system may multiply the DAC input to the comparator with the gain factor rather than the output of the ADC. This is the inverse operation compared to the typical post processing steps in a traditional SAR. Therefore, the inverse of the required gain (slope correction factor) must be used as the gain factor.

A step by step operation of the transpose SAR algorithm is displayed in Table 2. The system is designed to mirror the same one in Table 1. The SUM variable is pre-seeded to the two's compliment of 1 to act as the offset of +1. The gain factor is also set to 0.5 to have a resulting gain of 2 in the final outcome. As demonstrated, the final result from the transpose SAR ADC doubles the input value plus one.

TABLE 2

Transpose SAR Operation

| | | ADC | | | | |
| LSB<br>Gain<br>Cycle:Step | 1 V<br>2 => 'b0.1<br>SUM | Input<br>Offset<br>ADC | 5 V<br>+1<br>BUT | Shifted<br>gain | SUM +<br>Shift | ADC<br>Decision |
|---|---|---|---|---|---|---|
| 1:0 | 1111 | 0000 | 1000 | | | |
| 1:1 | 1111 | 0000 | 1000 | 0100 | | |
| 1:2 | 1111 | 0000 | 1000 | 0100 | 0011 | Y |
| 1:3a | 0011 | 1000 | 1000 | | | |
| 1:4 | 0011 | 1000 | 0100 | | | |
| 2:1 | 0011 | 1000 | 0100 | 0010 | | |
| 2:2 | 0011 | 1000 | 0100 | 0010 | 0101 | N |
| 2:3b | 0011 | 1000 | 0100 | | | |
| 2:4 | 0011 | 1000 | 0010 | | | |
| 3:1 | 0011 | 1000 | 0010 | 0001 | | |
| 3:2 | 0011 | 1000 | 0010 | 0001 | 0100 | Y |
| 3:3a | 0100 | 1010 | 0010 | | | |
| 3:4 | 0100 | 1010 | 0001 | | | |
| 4:1 | 0100 | 1010 | 0001 | 0000.1 | | |
| 4:2 | 0100 | 1010 | 0001 | 0000.1 | 0100.1 | Y |
| 4:3a | 0100.1 | 1011 | 0001 | | | |
| 4:4 | 0100.1 | 1011 | 0000.1 | | | |
| Final Result | | 1011 | 'd11 | | | |

Two further examples of the transpose SAR algorithm with a gain factor of 10 binary and 0.1 binary are illustrated below in Tables 3 and 4. In Tables 3 and 4, the Summed Result corresponds to the (SUM+Shift) values in the Tables 1 and 2.

TABLE 3

Dividing by 2 (gain factor = 2)

| | | 4-Bit ADC DAC | LSB = 1 V Result | Input = 7 V >=Input | Multiplication = 'b10 Summed Result | ADC Result |
|---|---|---|---|---|---|---|
| 1st Bit | Summed Result + | 00000 | | | | |
| | Bit under test * M = | 1[0]000 | | | | |
| | DAC Setting | 10000 | 16 V | Yes | 00000 | 0000 |
| 2nd Bit | Summed Result + | 00000 | | | | |
| | Bit under test * M = | 01[0]00 | | | | |
| | DAC Setting | 01000 | 8 v | Yes | 00000 | 0000 |
| 3rd Bit | Summed Result + | 00000 | | | | |
| | Bit under test * M = | 001[0]0 | | | | |
| | DAC Setting | 00100 | 4 v | No | 00100 | 0010 |
| 4th Bit | Summed Result + | 00100 | | | | |
| | Bit under test * M = | 0001[0] | | | | |
| | DAC Setting | 00110 | 6 V | No | 00110 | 0011 |

TABLE 4

Multiplying by 2 (gain factor = 0.5)

| | | 4-Bit ADC DAC | LSB = 1 V Result | Input = 7 V >=Input | Multiplication = 'b0.1 Summed Result | ADC Result |
|---|---|---|---|---|---|---|
| 1st Bit | Summed Result + | 0000 | | | | |
| | Bit under test * M = | [0]100 | | | | |
| | DAC Setting | 0100 | 4 V | No | 0100 | 1000 |
| 2nd Bit | Summed Result + | 0100 | | | | |
| | Bit under test * M = | 0[0]10 | | | | |
| | DAC Setting | 0110 | 6 V | No | 0110 | 1100 |
| 3rd Bit | Summed Result + | 0110 | | | | |
| | Bit under test * M = | 00[0]1 | | | | |
| | DAC Setting | 0111 | 7 V | Yes | 0110 | 1100 |
| 4th Bit | Summed Result + | 0110 | | | | |
| | Bit under test * M = | 000[0].1 | | | | |
| | DAC Setting | 0110.1 | 6.5 V | No | 0110.1 | 1101 |

It is important to highlight two differences in this algorithm. The inverse of the target gain has to be programmed into the system as the gain factor. This is why for a gain of 2, the examples in Table 2 and 4 use 0.5 as the gain. It is also important to note that for the offset in Table 2, to achieve an offset of positive 1, a negative 1 is used in 2's compliment form.

The eventual outcome returns an error of 1 LSB for both examples. The maximum value of this error is determined by the value of the remainder. It is important to note that the traditional SAR calibration returns an error within +/−1 LSB. An example with a greater error is given below in Table 5:

TABLE 5

Remainder Error

| 4-Bit ADC DAC | LSB = 1 V Result | Input = 7 V >=Input | Multiplication = 'b100 Summed Result | ADC Result |
|---|---|---|---|---|
| 100000 | 32 V | Yes | 000000 | 000000 |
| 010000 | 16 V | Yes | 000000 | 000000 |
| 001000 | 8 V | Yes | 000000 | 000000 |
| 000100 | 4 V | No | 000100 | 000001 |

There are three core improvements to the system and its implementation.

1. As can be seen from the examples above, the base algorithm requires further DAC bits. This is determined by the desired multiplication or division range. This is troublesome because increasing the DAC in either direction is expensive and difficult. This problem needs to be solved for both values greater and values smaller than the DAC range. For the high side, the system should detect that the current value desired to be programmed into the DAC is greater than the DAC range. This can be accomplished with an overflow bit in the summing node. The DAC should then be set to the maximum value possible. A modified example is shown below:

| Desired DAC | 4-Bit ADC Actual DAC | LSB = 1 V Result | Input = 7 V =>Input | Multiplication = 'b10 Summed Result | ADC Result |
|---|---|---|---|---|---|
| 10000 | 1111 | 15 V | Yes | 0000 | 0000 |
| 01000 | 1000 | 8 V | Yes | 0000 | 0000 |
| 00100 | 0100 | 4 V | No | 0100 | 0010 |
| 00110 | 0110 | 6 V | No | 0110 | 0011 |

For values smaller than the DAC range, the Summed Result simply needs to keep track of these values, but only map them to the DAC if the resulting value rolls back into LSB range. This will result in an error less than 1 LSB. An example is given in the table below:

| Desired DAC | 4-Bit ADC Actual DAC | LSB = 1 V Result | Input = 7 V =>Input | Multiplication = 'b0.1 Summed Result | ADC Result |
|---|---|---|---|---|---|
| 0100 | 0100 | 4 V | No | 0100 | 1000 |
| 0110 | 0110 | 6 V | No | 0110 | 1100 |
| 0111 | 0111 | 7 V | Yes | 0110 | 1100 |
| 0110.1 | 0110 | 6 V | No | 0110.1 | 1101 |

A more complex example is shown in the following table:

| Desired DAC | 4-Bit ADC Actual DAC | LSB = 1 V Result | Input = 7 V =>Input | Multiplication = 'b0.11 Summed Result | ADC Result |
|---|---|---|---|---|---|
| 0110 | 0110 | 6 V | No | 0110 | 1000 |
| 1001 | 1001 | 9 V | Yes | 0110 | 1000 |
| 0111.1 | 0111 | 7 V | Yes | 0110 | 1000 |
| 0110.11 | 0110 | 6 V | No | 0110.11 | 1001 |

2. As discussed previously the level of error in the system is determined by the size of the remainder after division. The system can continue to calculate the remainder by continuing the SAR for some further steps. This can be done with or without the improvement of point 1. As long as the Summed Result keeps track of remaining bits and rolls those into the DAC LSB bit, this keeps the potential error in final result in the range of +/−1 LSB. The following table continues the example from above:

| Desired DAC | 4-Bit ADC Actual DAC | LSB = 1 V Result | Input = 7 V =>Input | Multiplication = 'b0.11 Summed Result | ADC Result |
|---|---|---|---|---|---|
| 0110 | 0110 | 6 V | No | 0110 | 1000 |
| 1001 | 1001 | 9 V | Yes | 0110 | 1000 |
| 0111.1 | 0111 | 7 V | Yes | 0110 | 1000 |
| 0110.11 | 0110 | 6 V | No | 0110.11 | 1001 |
| 0111.001 | 0111 | 7 V | Yes | 0110.11 | 1001.0 |
| 0110.1111 | 0110 | 6 V | No | 0110.1111 | 1001.01 |

The previous example returned an ADC result of 9V, as seen in step 4. 9V multiplied by 0.75 is 6.75V, which has a 0.25V error. By continuing the sequence, the end result is 9.25V, which results in a final value of 6.9375V, much closer to the actual result. Combining both 1 and 2 results in the following table:

| Desired DAC | 4-Bit ADC Actual DAC | LSB = 1 V Result | Input = 7 V =>Input | Multiplication = 'b100 Summed Result | ADC Result |
|---|---|---|---|---|---|
| 100000 | 1111 | 15 V | Yes | 0000 | 0000 |
| 010000 | 1111 | 15 V | Yes | 0000 | 0000 |
| 001000 | 1000 | 8 V | Yes | 0000 | 0000 |
| 000100 | 0100 | 4 V | No | 0100 | 0001 |
| 000110 | 0110 | 6 V | No | 0110 | 0001.1 |
| 000111 | 0111 | 7 V | Yes | 0110 | 0001.10 |

3. For the described ADC mapping and calibration, both a gain and offset are calculated. So far the system has only adjusted the gain through the change in algorithm. The offset can be easily added to the system as well. This can be done by either pre-seeding the Summed result with the offset value or adding the offset value to the final ADC result.

The described modification of the SAR algorithm makes area savings possible since a post-processing multiplier and/or post-processing adder are no longer required. In the exemplary simulation shown in the table below, a saving of approximately 5-6% has been achieved. The area estimate has been determined for the described Transpose SAR ADC. The simulation is based on a 6 channel 12-bit SAR ADC. The area comparison can be seen from the below table:

| | Area (Sq μm) | Area in Gates |
|---|---|---|
| Transposing SAR Block | | |
| New SAR ADC | 10596.5439 | 564 |
| Registers required for calibration | 18972.4 | 1063 |
| ADC control without multiplier | (68531.0078 − 8000) | 3164 |
| Total | 90984.4 | 4792 |
| SAR Block | | |
| TraditionalSAR | 7956.0319 | 423 |
| Calibration Engine | 68531.0078 | 3645 |
| Registers required for calibration | 18972.4 | 1063 |
| Total | 95459.4397 | 5131 |

For this comparison the traditional SAR ADC control was replaced with the transpose SAR ADC control. The Transpose SAR ADC control requires an additional 140 gates but saves 500 gates by removing the need for the post processing multiplier. This results in approximately a 5-6% area reduction in the ADC.

For this ADC the primary area employed is for the calibration engine. This may include round-robin selection, warmup selection, ADC clock, test logic, averaging, offset addition, multiple conversion options and the multiplier. A simpler ADC will result in a larger percentage savings. The area savings should also be proportional to the number of bits in the ADC.

As a further advantage, it becomes possible to calculate the ADC remainder from a measurement. This can allow the ADC to return more bits than the DAC range as it calculates fractional bits (see e.g. the above-described improvement 2).

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. An analog-to-digital converter ADC configured to convert an analog input signal into a digital output signal comprising N bits $o_n$, $n \in \{0, \ldots, N-1\}$, the ADC comprising a controller, a digital-to-analog converter DAC, and a comparator, wherein the comparator is configured to generate a binary signal by comparing the analog input signal with an analog output signal of the DAC;

the controller is configured to receive the binary signal generated by the comparator and to generate, based on the binary signal, a digital control signal comprising N bits $c_n$, $n \in \{0, \ldots, N-1\}$; and the DAC is configured to generate the analog output signal based on the digital control signal generated by the controller;

wherein the controller comprises a register configured to store a previous sum value and an adder configured to determine a test sum value by adding, when the ADC determines a bit $o_n$ of the digital output signal, the previous sum value and a test value corresponding to $2^n$ times a gain factor.

2. The ADC of claim 1, wherein the test value is represented by a binary representation of the gain factor which is shifted by n bits.

3. The ADC of claim 1, wherein the controller is configured to generate the digital control signal based on the test sum value, and, if the binary signal indicates that the analog input signal is greater than the analog output signal corresponding to the test sum value, to store the test sum value in the register as a new sum value.

4. The ADC of claim 1, wherein the ADC is configured to set the bit $o_n$ of the digital output signal to 1 if the binary signal indicates that the analog input signal is greater than the analog output signal corresponding to the test sum value.

5. The ADC of claim 1, wherein the ADC is configured to set the bit $o_n$ of the digital output signal to 0 if the binary signal indicates that the analog input signal is smaller than the analog output signal corresponding to the test sum value.

6. The ADC of claim 1, wherein the controller is configured to start the analog-to-digital conversion with the most significant bit MSB $o_{N-1}$ of the digital output signal by initializing the previous sum value to 0 or to a predetermined offset value.

7. The ADC of claim 1, wherein the ADC is configured to start the analog-to-digital conversion by determining the most significant bit MSB $o_{N-1}$ of the digital output signal first, and continuing, bit by bit, until the least significant bit LSB $o_0$ of the digital output signal is determined.

8. A controller for controlling operation of an analog-to-digital converter ADC configured to convert an analog input signal into a digital output signal comprising N bits $o_n$, $n \in \{0, \ldots, N-1\}$, the ADC comprising a digital-to-analog converter DAC and a comparator, wherein the comparator is configured to generate a binary signal by comparing the analog input signal with an analog output signal of the DAC, and the DAC is configured to generate the analog output signal based on a digital control signal, wherein the controller is configured to receive the binary signal generated by the comparator and to generate, based on the binary signal, the digital control signal comprising N bits $c_n$, $n \in \{0, \ldots, N-1\}$ for controlling the DAC; and the controller comprises a register configured to store a previous sum value and an adder configured to determine a test sum value by adding, when determining a bit $o_n$ of the digital output signal, the previous sum value and a test value corresponding to $2^n$ times a gain factor.

9. The controller of claim 8, wherein the test value is represented by a binary representation of the gain factor which is shifted by n bits.

10. The controller of claim 8, wherein the controller is configured to generate the digital control signal based on the test sum value, and, if the binary signal indicates that the analog input signal is greater than the analog output signal corresponding to the test sum value, to store the test sum value in the register as a new sum value.

11. The controller of claim 8, wherein the controller is configured to set the bit $o_n$ of the digital output signal to 1 if the binary signal indicates that the analog input signal is greater than the analog output signal corresponding to the test sum value.

12. The controller of claim 8, wherein the controller is configured to set the bit $o_n$ of the digital output signal to 0 if the binary signal indicates that the analog input signal is smaller than the analog output signal corresponding to the test sum value.

13. The controller of claim 8, wherein the controller is configured to start the analog-to-digital conversion with the most significant bit MSB $o_{N-1}$ of the digital output signal by initializing the previous sum value to 0 or to a predetermined offset value.

14. The controller of claim 8, wherein the controller is configured to start the analog-to-digital conversion by determining the most significant bit MSB $o_{N-1}$ of the digital output signal first, and continuing, bit by bit, until the least significant bit LSB $o_0$ of the digital output signal is determined.

15. A method of converting an analog input signal into a digital output signal comprising N bits $o_n$, $n \in \{0, \ldots, N-1\}$ using a digital-to-analog converter DAC and a comparator, the method comprising:

generating, by the comparator, a binary signal by comparing the analog input signal with an analog output signal of the DAC;

generating, by the DAC, the analog output signal based on a digital control signal comprising N bits $c_n$, $n \in \{0, \ldots, N-1\}$;

generating, based on the binary signal, the digital control signal for controlling the DAC;

storing a previous sum value; and determining a test sum value by adding, when determining a bit $o_n$ of the digital output signal, the previous sum value and a test value corresponding to $2^n$ times a gain factor.

16. The method of claim 15, wherein the test value is obtained by shifting a binary representation of the gain factor by n bits.

17. The method of claim 15, further comprising the steps of:

generating the digital control signal based on the test sum value;

and, if the binary signal indicates that the analog input signal is greater than the analog output signal corresponding to the test sum value, storing the test sum value as a new sum value.

18. The method of claim 15, further comprising the step of:

setting the bit $o_n$ of the digital output signal to 1 if the binary signal indicates that the analog input signal is greater than the analog output signal corresponding to the test sum value.

19. The method of claim 15, further comprising the step of:

setting the bit $o_n$ of the digital output signal to 0 if the binary signal indicates that the analog input signal is smaller than the analog output signal corresponding to the test sum value.

20. The method of claim 15, further comprising the step of:

starting the analog-to-digital conversion with the most significant bit MSB $o_{N-1}$ of the digital output signal by initializing the previous sum value to 0 or to a predetermined offset value.

21. The method of claim 15, further comprising the steps of:

starting the analog-to-digital conversion by determining the most significant bit MSB $o_{N-1}$ of the digital output signal first, and continuing, bit by bit, until the least significant bit LSB $o_0$ of the digital output signal is determined.

22. The method of claim 15, further comprising the steps of:

determining further $o_n$-values by adding the previous sum value and a further test value corresponding to $2^n$ times the gain factor, wherein n is an integer which is either smaller than 0 or greater then N−1; and amending the digital control signal, $c_m$, wherein the new corresponding test sum maps to the $\{0, \ldots, M-1\}$-range of said digital control signal or setting to maximum that range if exceeded upon finally returning an expanded output signal comprising bits $o_n$, $n \in \{0, \ldots, N-1\}$ based on said determined further test sum value.

\* \* \* \* \*